(12) United States Patent
Harada et al.

(10) Patent No.: US 9,630,783 B2
(45) Date of Patent: Apr. 25, 2017

(54) ALIGNING AND FEEDING DEVICE AND ALIGNING METHOD

(71) Applicant: MURATA MANUFACTURING CO., LTD., Kyoto-fu (JP)

(72) Inventors: Masatoshi Harada, Nagaokakyo (JP); Miki Kurabe, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/244,338

(22) Filed: Aug. 23, 2016

(65) Prior Publication Data
US 2016/0355353 A1 Dec. 8, 2016

Related U.S. Application Data

(63) Continuation of application No. PCT/JP2015/054336, filed on Feb. 17, 2015.

(30) Foreign Application Priority Data

Feb. 27, 2014 (JP) .................................. 2014-037534

(51) Int. Cl.
*B65G 47/14* (2006.01)
*H01L 21/68* (2006.01)

(52) U.S. Cl.
CPC .......... *B65G 47/1485* (2013.01); *H01L 21/68* (2013.01); *B65G 2811/0626* (2013.01)

(58) Field of Classification Search
CPC ................... B65G 47/1485; B65G 2811/0626
See application file for complete search history.

(56) References Cited

U.S. PATENT DOCUMENTS

| | | | | |
|---|---|---|---|---|
| 4,235,014 A | * | 11/1980 | DuBois | H01L 21/67271 228/49.1 |
| 5,337,465 A | * | 8/1994 | Tamaki | H05K 13/022 29/740 |
| 5,454,464 A | * | 10/1995 | Yamamoto | B65G 47/848 198/384 |
| 6,189,733 B1 | | 2/2001 | Nemoto et al. | |

(Continued)

FOREIGN PATENT DOCUMENTS

| | | |
|---|---|---|
| JP | S48-051077 U | 7/1973 |
| JP | S50-140181 U | 11/1975 |

(Continued)

OTHER PUBLICATIONS

International Search Report issued in PCT/JP2015/054336; mailed May 26, 2015.

(Continued)

*Primary Examiner* — Thomas Randazzo
(74) *Attorney, Agent, or Firm* — Studebaker & Brackett PC

(57) ABSTRACT

An aligning and feeding device which accommodates a component including a pair of rectangular end surfaces oppositely facing each other and having a longitudinal direction extending between the end surfaces of the component in a cavity formed in an accommodating member. The component is accommodated in the cavity by aligning a direction of the component such that the longitudinal direction of the component extends parallel to a main surface of the accommodating member.

6 Claims, 10 Drawing Sheets

(56) References Cited

U.S. PATENT DOCUMENTS

| | | | | |
|---|---|---|---|---|
| 6,227,345 | B1* | 5/2001 | Miyamoto | B65G 47/1457 |
| | | | | 198/392 |
| 6,540,065 | B2* | 4/2003 | Kurabe | B65G 47/1485 |
| | | | | 198/471.1 |
| 7,704,033 | B2* | 4/2010 | Garcia | H05K 13/021 |
| | | | | 198/397.04 |
| 7,743,913 | B2* | 6/2010 | Ikeda | B65G 47/1457 |
| | | | | 198/380 |
| 9,422,117 | B2* | 8/2016 | Sano | B65G 47/14 |
| 2004/0187446 | A1 | 9/2004 | Takagi et al. | |

FOREIGN PATENT DOCUMENTS

| | | |
|---|---|---|
| JP | S53-086241 U | 7/1978 |
| JP | 2000-128341 A | 5/2000 |
| JP | 2002-029627 A | 1/2002 |
| JP | 2002-187612 A | 7/2002 |
| JP | 2004-315227 A | 11/2004 |

OTHER PUBLICATIONS

Written Opinion issued in PCT/JP2015/054336; mailed May 26, 2015.
International Preliminary Report on Patentability issued in PCT/JP2015/054336; issued on Aug. 30, 2016.

* cited by examiner

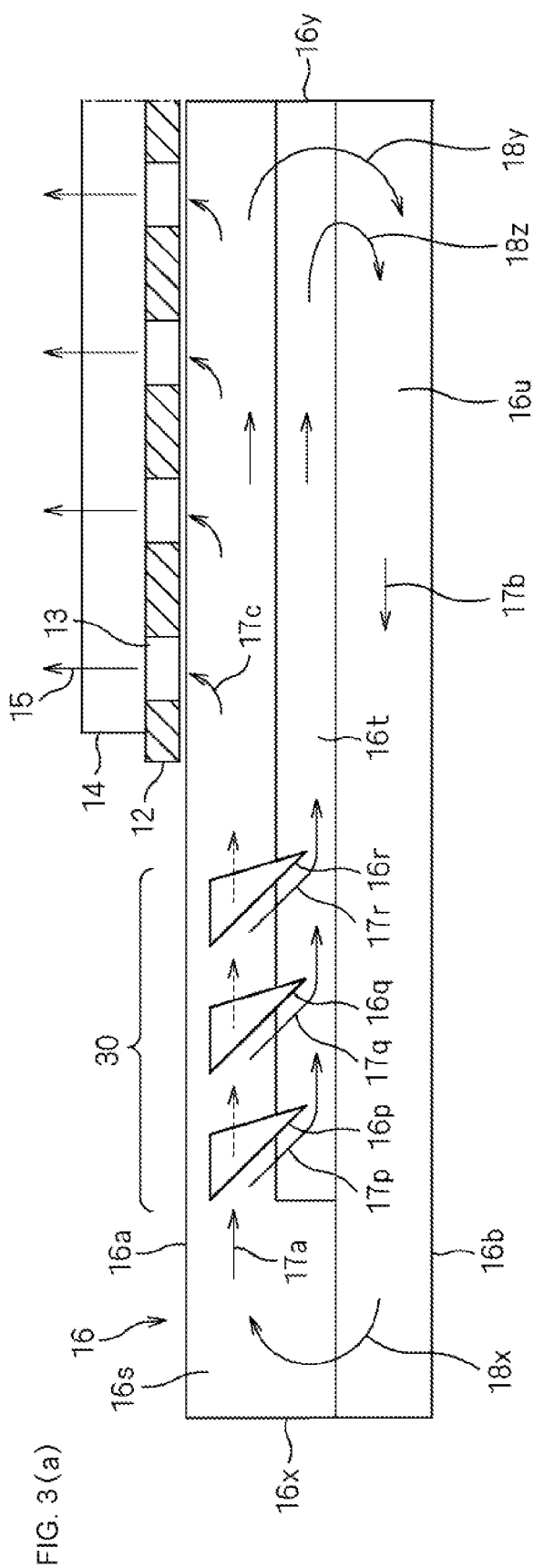
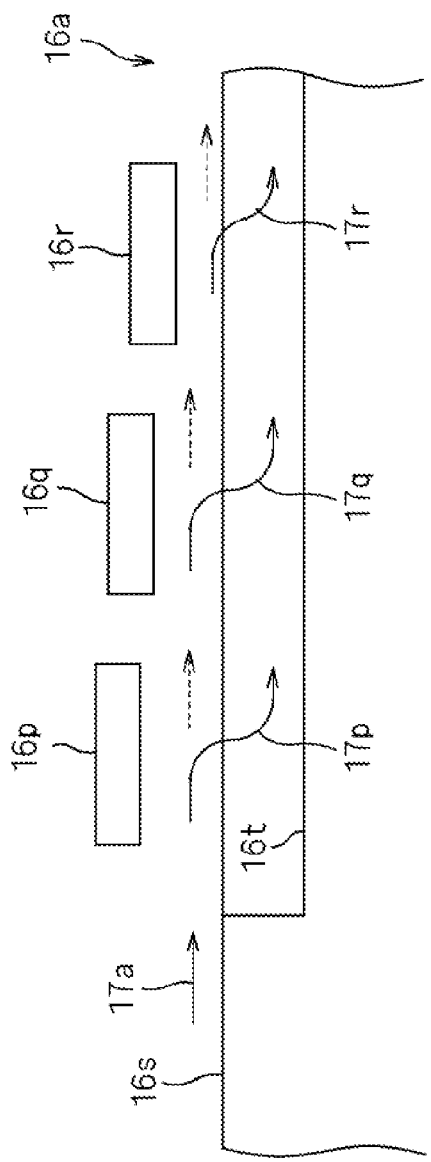
FIG. 3(a)
FIG. 3(b)

ALIGNING AND FEEDING DEVICE AND ALIGNING METHOD

CROSS REFERENCE TO RELATED APPLICATIONS

This application claims benefit of priority to Japanese Patent Application 2014-037534 filed Feb. 27, 2014, and to International Patent Application No. PCT/JP2015/054336 filed Feb. 17, 2015, the entire content of which is incorporated herein by reference.

TECHNICAL FIELD

The present disclosure relates to an aligning and feeding device and an aligning method, and more particularly to an aligning and feeding device and an aligning method where components each having a rectangular parallelepiped shape can be accommodated in an aligned state.

BACKGROUND

Conventionally, there has been known a device where components can be accommodated in an aligned state. For example, in a device 101 shown in FIG. 13 (a schematic front view) and FIG. 14 (a horizontal cross-sectional view), a disc-like rotor 131 is disposed adjacent to a feeder 102 which circulates components 111 on a conveyance surface 122. The rotor 131 is an accommodating member, and cavities 132 which penetrate between main surfaces and capable of accommodating components are formed in the rotor 131.

When the component 111 on the conveyance surface 122 approaches the cavity 132 formed in the rotor 131, the component 111 is sucked and moves into the cavity 132 from one main surface 131a side of the rotor 131, and is accommodated in the cavity 132. The component 111 accommodated in the cavity 132 is moved along with the rotation of the rotor 131 indicated by an arrow K, electric characteristics of the component 111 are measured in an electric measuring component 141 in a zone A. When it is determined that the component 111 is defective, the defective component is discharged from a defective component discharging component 142 in a zone B, and when it is determined that the component 111 is not defective, the non-defective component is discharged from a non-defective component discharge component 143 in a zone C.

For example, in the case of the component 111 where an electrode is formed on end surfaces which oppositely face with each other, the component 111 is inserted into the cavity having an opening slightly larger than the end surface of the component 111 with the end surface of the component heading into the cavity, and electric characteristics are measured by bringing measurement terminals into contact with the component exposed to both sides of the rotor 131 (see JP-A-2004-315227, for example).

SUMMARY

Problem to be Solved by the Disclosure

Depending on a component, an electrode is not formed on end surfaces of the component but is formed on side surfaces of the component. Electric characteristics of such a component can be measured by accommodating the component in a cavity formed in an accommodating member such that the side surfaces of the component are exposed.

However, with respect to a component having a rectangular parallelepiped shape where a direction extending between end surfaces is set as a longitudinal direction, when the cavity is formed such that the side surfaces of the component are exposed, the component can be inserted into the cavity from the end surface of the component as well as from the side surface of the component and hence, the side surface of the component is not exposed in a fixed direction whereby the measurement of electric characteristics is impaired. To expose the side surface of the component in the fixed direction, it is necessary to align the direction of the component such that the longitudinal direction of the component is disposed parallel to the main surface of the accommodating member when the component is accommodated in the cavity.

The present disclosure has been made in view of such circumstances. It is an object of the present disclosure to provide an aligning and feeding device and an aligning method where a component having a rectangular parallelepiped shape which has a pair of rectangular end surfaces oppositely facing each other and a direction extending between end surfaces is set as a longitudinal direction can be accommodated in a cavity formed in an accommodating member by aligning a direction of the component such that a longitudinal direction of the component is disposed parallel to a main surface of the accommodating member.

Means for Solving the Problem

To overcome the above-mentioned problem, the present disclosure provides an aligning and feeding device having the following configuration.

The aligning and feeding device is an aligning and feeding device of a type used for a component having a rectangular parallelepiped shape where the component includes a pair of rectangular end surfaces which oppositely face each other and four side surfaces which connect the end surfaces to each other and a direction extending between the end surfaces of the component is set as a longitudinal direction. The aligning and feeding device includes: (a) a conveyance surface; (b) a component passage; (c) an accommodating member; and (d) a suction member. (a) The conveyance surface allows the relative movement of the component placed on the conveyance surface. (b) The component passage is disposed above the conveyance surface, has a first opening and a second opening, and extends from the first opening to the second opening. The component passage has a width which is larger than at least one of a length between one pair of side surfaces of the component which oppositely face each other and a length between the other pair of side surfaces of the component which oppositely face each other and is smaller than a length between the end surfaces of the component. (c) The accommodating member has a main surface, and a plurality of cavities. The cavities are continuously formed with the main surface, extend in an extending direction which is a direction parallel to the main surface, and are configured to accommodate the component such that the extending direction and the longitudinal direction of the component agree with each other. The accommodating member may be disposed such that the cavities extend parallel to the conveyance surface, one end side of each of the cavities in the extending direction is disposed adjacent to the second opening, and the other end side of each of the cavities in the extending direction and the component passage make an obtuse angle. (d) The suction member is configured to apply a vacuum suction to the other end side of the cavity in the extending direction when the accommodating member is disposed such that the cavity extends parallel to the conveyance surface, one end side of the cavity in the extending direction is disposed adjacent to the second opening, and the other end side of the cavity in the extending direction and the component passage make an obtuse angle.

With such a configuration, a component placed on the conveyance surface is moved into the cavity formed in the accommodating component through the component passage, and the component can be accommodated in the cavity such that the extending direction of the cavity extending parallel to the main surface of the accommodating member agrees with the longitudinal direction of the component. Accordingly, by aligning the direction of the component such that the longitudinal direction of the component extends parallel to the main surface of the accommodating member, the component can be accommodated in the cavity formed in the accommodating member.

It is preferable that the aligning and feeding device further include a height restricting member which is disposed upstream of the first opening of the component passage in a moving direction of the component such that a gap of a predetermined height is formed between the conveyance surface and the height restricting member, and only the component which passes through the gap is allowed to enter the component passage or to approach the first opening. The length between one pair of side surfaces is larger than the length between the other pair of side surfaces. The predetermined height is smaller than the length between one pair of side surfaces of the component which oppositely face each other and is larger than the length of the other pair of side surfaces of the component which oppositely face each other.

In this case, the component which passes between the height restricting member and the conveyance surface is conveyed in a state where one of the other pair of side surfaces which oppositely face each other is supported by the conveyance surface, and the component is accommodated in the cavity formed in the accommodating member. Accordingly, the component can be accommodated in the cavity formed in the accommodating member while the direction of the component in the lateral direction is also aligned.

It is preferable that the aligning and feeding device further include an introducing guide surface disposed upstream of the component passage in a moving direction of the component and above the conveyance surface. The introducing guide surface is configured such that, as viewed in a plan view of the aligning and feeding device, the introducing guide surface extends to the component passage by being bent or curved, the conveyance surface extends in conformity with a bent or a curved shape of the introducing guide surface, and the component is movable on the conveyance surface along the introducing guide surface.

In this case, a space in which the component is movable is formed outside the bent or curved portion of the introducing guide surface. Therefore, the direction of the component which moves along the introducing guide surface can be changed without being interfered with by a component arranged parallel to the component or a succeeding component at the time of changing the direction of the component along the bent or the curved portion of the introducing guide surface. Accordingly, the component which moves along the introducing guide surface can be moved to the component passage with certainty and hence, a component filling rate of the cavities can be enhanced.

The present disclosure also provides an aligning method having the following configuration to overcome the above-mentioned problem.

The aligning method is an aligning method for aligning a component having a rectangular parallelepiped shape where the component includes a pair of rectangular end surfaces which oppositely face each other and four side surfaces which connect the end surfaces to each other and a direction extending between the end surfaces of the component is set as a longitudinal direction, the aligning method including first to third steps. (i) In the first step, the component is supplied onto a conveyance surface. (ii) In the second step, while moving the component supplied onto the conveyance surface, the component is made to enter a component passage having a first opening and a second opening, extending from the first opening to the second opening, and having a width which is larger than at least one of a length between one pair of side surfaces of the component which oppositely face each other and a length between the other pair of side surfaces of the component which oppositely face each other and is smaller than a length between the end surfaces of the component or to approach the first opening. (iii) In the third step, (a) an accommodating member having a main surface and a plurality of cavities which are continuously formed with the main surface, extend in an extending direction which is a direction parallel to the main surface and are configured to accommodate the component such that the extending direction and the longitudinal direction of the component agree with each other is disposed, (b) a vacuum suction is applied to the inside of each of the cavities from the other end side in the extending direction in a state where the cavities extend parallel to the conveyance surface, one end side of each of the cavities in the extending direction is disposed adjacent to the second opening, and the other end side of each of the cavities in the extending direction and the component passage make an obtuse angle, (c) the component which enters the component passage or approaches the first opening is moved to the corresponding cavity through the component passage, and the component is accommodated in the corresponding cavity in a state where the longitudinal direction of the component and the extending direction of the corresponding cavity agree with each other.

According to the above-mentioned method, a component placed on the conveyance surface can be moved to the cavity formed in the accommodating member through the component passage, and the component can be accommodated in the cavity such that the extending direction of the cavity which extends parallel to the main surface of the accommodating member agrees with the longitudinal direction of the component. Accordingly, by aligning the direction of the component such that the longitudinal direction of the component extends parallel to the main surface of the accommodating member the component can be accommodated in the cavity formed in the accommodating member.

It is preferable that, in the first step, a height restricting member which forms a gap of a predetermined height between the conveyance surface and the height restricting member is disposed, and only the component which passes through the gap is allowed to enter the component passage or to approach the first opening. The length between one pair of side surfaces is larger than the length between the other pair of side surfaces. The predetermined height is smaller than the length between one pair of side surfaces of the component which oppositely face each other and is larger than the length of the other side surfaces of the component which oppositely face each other.

In this case, a component which passes through between the height restricting member and the conveyance surface is conveyed in a state where one of the other pair of side surfaces which oppositely face each other is supported on the conveyance surface, and the component is accommodated in the cavity formed in the accommodating member. Accordingly, the component can be accommodated in the cavity formed in the accommodating member while the direction of the component in the lateral direction is also aligned.

It is preferable that, in the second step, the component supplied onto the conveyance surface is made to enter the component passage or to approach the first opening by making the component move on the conveyance surface which extends in conformity with a bent or curved shape of an introducing guide surface along the bent or curved introducing guide surface as viewed in a plan view.

In this case, a space in which the component is movable is formed outside the bent or curved portion of the introducing guide member and hence, the direction of the component which moves along the introducing guide surface can be changed without being interfered with by a component arranged parallel to the component or a succeeding component at the time of changing the direction of the component by the bent or the curved portion of the introducing guide surface. Accordingly, the component which moves along the introducing guide surface can be moved to the component passage with certainty and hence, a component filling rate of the cavities can be enhanced.

Advantageous Effects of Disclosure

According to the present disclosure, a component having a rectangular parallelepiped shape where the component includes a pair of rectangular end surfaces which oppositely face with each other and a longitudinal direction of the component extending between the end surfaces is set as a longitudinal direction can be accommodated in the cavity formed in the accommodating member while the direction of the component is aligned such that the longitudinal direction of the component extends parallel to the main surface of the accommodating member.

BRIEF DESCRIPTION OF THE DRAWINGS

FIG. 3(a) and FIG. 3(b) are views showing the schematic configuration of a feeder, wherein FIG. 3(a) is a schematic plan view and FIG. 3(b) is a schematic front view of a main component (embodiment 1).

FIG. 4(a) to FIG. 4(c) are views showing the schematic configuration of a component transfer portion where a component is transferred from the feeder to the rotor, wherein FIG. 4(a) is a schematic plan view, FIG. 4(b) is a schematic front view and FIG. 4 (c) is a schematic front view (embodiment 1).

DETAILED DESCRIPTION OF THE DRAWINGS

Embodiments of the present disclosure are described with reference to drawings hereinafter.

Embodiment 1

An aligning and feeding device 10 according to an embodiment 1 is described with reference to FIG. 1 to FIG. 9(b).

Figure 1:
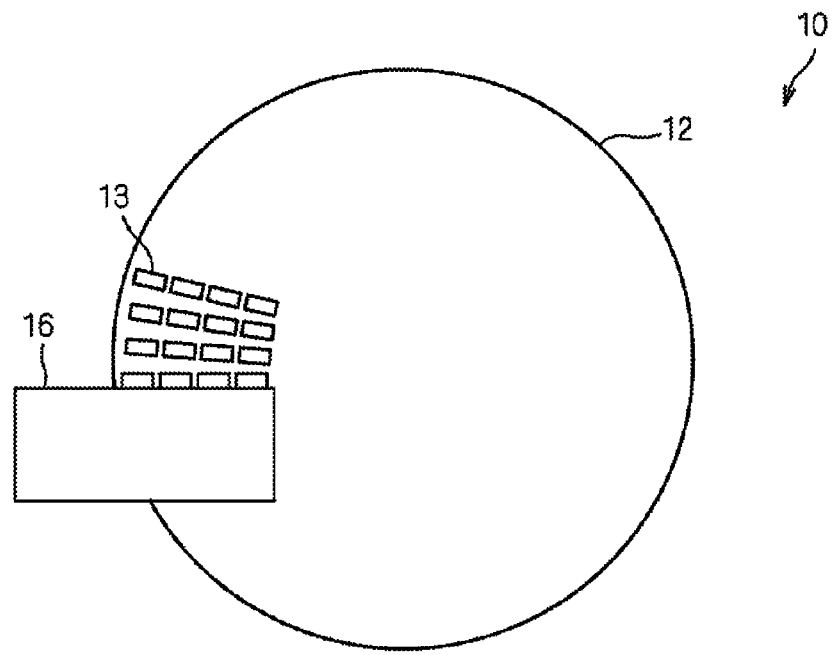
FIG. 1 is a schematic front view showing the schematic configuration of an aligning and feeding device (embodiment 1).

FIG. 1 is a schematic front view showing the schematic configuration of the aligning and feeding device 10. As shown in FIG. 1, the aligning and feeding device 10 includes: a disc-like rotor 12; and a feeder 16. The rotor 12 is an accommodating member, and a plurality of cavities 13 for accommodating components are formed in the rotor 12. Although only some cavities 13 are shown in FIG. 1, four series of cavities 13 are concentrically formed at equal angular intervals in a circumferential direction. The feeder 16 is disposed adjacent to the rotor 12, conveys the components in a predetermined direction, and supplies the components into the cavities 13. For example, the rotor 12 is intermittently rotated and the components are accommodated in the cavities 13 sequentially. One component is accommodated in each of the cavities 13 while the component is aligned in a predetermined direction.

Figure 2:
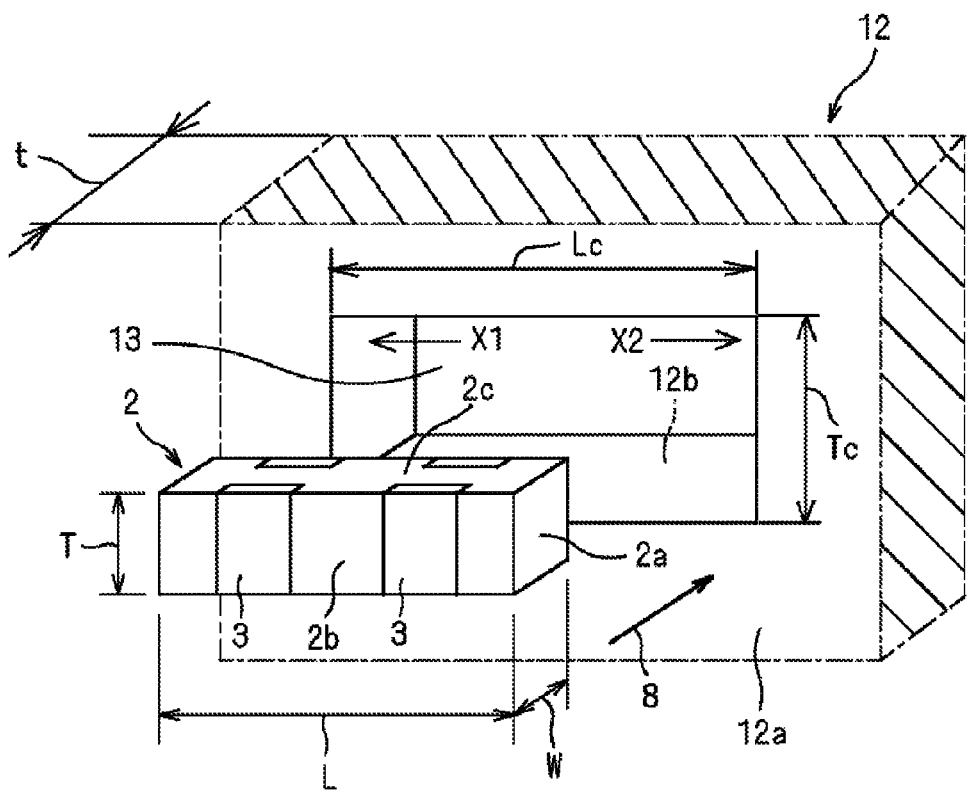
FIG. 2 is a perspective view of a rotor and a component (embodiment 1).

FIG. 2 is a perspective view of the rotor 12 and a component 2. As shown in FIG. 2, the cavity 13 having a rectangular parallelepiped shape which penetrates between main surfaces 12a, 12b of the rotor 12 is formed such that the longitudinal direction of the cavity 13 is disposed parallel to the main surface 12a. That is, the cavity 13 is formed such that the cavity 13 is continuously formed from the main surface 12a and extends in one direction parallel to the main surface 12a (left-and-right direction in FIG. 2). In this embodiment, as shown in FIG. 2, one end side of the cavity 13 in the extending direction is referred to as an extending directional one end side X1, and the other end side of the cavity 13 in the extending direction is referred to as an extending directional the other end side X2.

The component 2 has a rectangular parallelepiped shape. That is, the component 2 has one pair of rectangular end surfaces 2a which oppositely face each other, one pair of side surfaces 2b which oppositely face each other and the other pair of side surfaces 2c which oppositely face each other. The side surfaces 2b and the side surfaces 2c connect the end surfaces 2a to each other. The longitudinal direction extends between the end surfaces 2a. That is, assuming a length (distance) between the end surfaces 2a of the component 2 as "L," a length (distance) between the pair of side surfaces 2b which oppositely face each other as "W," and a length (distance) between the other pair of side surfaces 2c which oppositely face each other as "T," the relationship of L>W and the relationship of L>T are established. The pair of side surfaces 2b which oppositely face each other is referred to as LT surfaces, and the other pair of side surfaces 2c is referred to as LW surfaces. The length between one pair of side surfaces 2b is larger than the length between the other pair of side surfaces 2c. However, the present disclosure is not limited to such relationships.

The cavity 13 is formed such that the component 2 can be accommodated in the cavity 13, and the side surfaces 2b of the component 2 accommodated in the cavity 13 are exposed on both sides of the rotor 12. That is, assuming a thickness of the rotor 12 as "t," a size of the cavity in a lateral direction (a size in a vertical direction in FIG. 2) as "Tc," and a size of the cavity in a longitudinal direction (a size in a left-and-right direction in FIG. 2) as "Lc," the relationship of t<W, the relationship of Tc>T, and the relationship of Lc>L are established. In the case of the component 2 where W=1.0 mm, T=0.8 mm and L=1.2 mm, for example, sizes t, Tc and Lc are set such that t=0.85 mm, Tc=0.9 mm, and Lc=1.8 mm.

In this manner, by forming the cavity 13 such that the cross section parallel to the main surface 12a becomes slightly larger than the LT surface, and by inserting the component 2 into the cavity 13 from the LT surface as indicated by an arrow 8, it is possible to accommodate the component 2 in the cavity 13 in a state where the longitudinal direction of the component 2 is disposed parallel to the main surface 12a of the accommodating member 12. However, in this case, the component 2 can be inserted into the cavity 13 also from the end surface 2a. Accordingly, even when the component 2 is simply sucked, the direction of the component 2 accommodated in the cavity 13 cannot be aligned. Accordingly, as will be described in detail later, a component passage 22 or the like is formed such that the longitudinal direction of the component 2 accommodated in the cavity 13 is disposed parallel to the main surface 12a of the accommodating member 12.

FIG. 3(a) is a schematic plan view showing the schematic configuration of the feeder 16. FIG. 3(b) is a schematic front view showing the schematic configuration of a main part of the feeder 16. As shown in FIG. 3(a), the feeder 16 includes: a first portion 16a which conveys a component toward the other end 16y side from one end 16x side of the feeder 16 as indicated by an arrow 17a; and a second portion 16b which conveys a component in the reverse direction as indicated by an arrow 17b. The first portion 16a and the second portion 16b move a component placed on conveyance surfaces 16s, 16t and 16u by vibrations imparted to the conveyance surfaces 16s, 16t and 16u. Although not shown in FIG. 3(a), a guide portion is provided to the first portion 16a and the second portion 16b so as to restrict a conveyance path for components and to prevent a component from falling from the feeder 16.

At an intermediate position of the first portion 16a of the feeder 16, a selection component 30 having scrapers 16p to 16r is provided. A gap of a predetermined height is formed between the conveyance surface 16s and the scrapers 16p to 16r. On the other end 16y side of the selection component 30, the rotor 12 is disposed adjacent to the first portion 16a. On a side of the rotor 12 opposite to the first portion 16a, a suction member 14 is disposed. The suction member 14 is configured to suck the inside of the cavity 13 of the rotor 12 as indicated by an arrow 15.

In the first portion 16a, components are supplied as desired onto the conveyance surface 16s on the one end 16x side from a hopper not shown in the drawing. At this stage of operation, components placed on the conveyance surface 16s take arbitrary postures. That is, the components whose LW surfaces are supported on the conveyance surface 16s and the components whose LT surfaces are supported on the conveyance surface 16s are mixedly disposed.

As shown in FIG. 3(a) and FIG. 3(b), with respect to the components conveyed toward the other end 16y from the one end 16x side on the conveyance surface 16s of the first portion 16a, in the selection component 30, the components having a height exceeding a predetermined height (a height of the gap formed between the conveyance surface 16s and the scrapers 16p to 16r) are introduced to a conveyance surface 16t disposed lower than the conveyance surface 16s as indicated by arrows 17p to 17r, and the components having a height not exceeding the predetermined height pass below the scrapers 16p to 16r as indicated by an arrow indicated by a broken line. That is, the scrapers 16p to 16r are height restricting members.

For example, in the case of the component having the relationship of W>T (see FIG. 2), heights of all gaps formed between respective scrapers 16p to 16r and the conveyance surface 16s are set larger than T, and a height of a gap between at least one of the scrapers 16p to 16r and the conveyance surface 16s is set smaller than W. In this case, only the components whose LW surfaces are supported on the conveyance surface 16s pass below the scrapers 16p to 16r.

Some of the components which have passed below the scrapers 16p to 16r are moved to the cavities 13 formed in the rotor 12 which is disposed adjacent to the first portion 16a as indicated by an arrow 17c in FIG. 3(a). Other remaining components are conveyed to the other end 16y side of the first portion 16a and, thereafter, as indicated by arrows 18y, 18z, the other remaining components are introduced to the conveyance surface 16u of the second portion 16b and, thereafter, as indicated by arrow 18x, the other remaining components are returned onto the conveyance surface 16s of the first portion 16a on the one end 16x side.

Figure 4A:
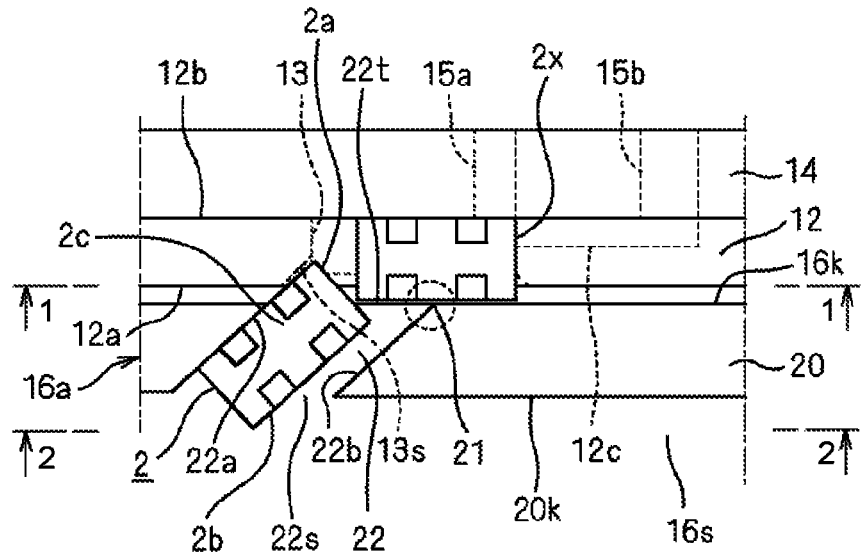
Figure 4B:
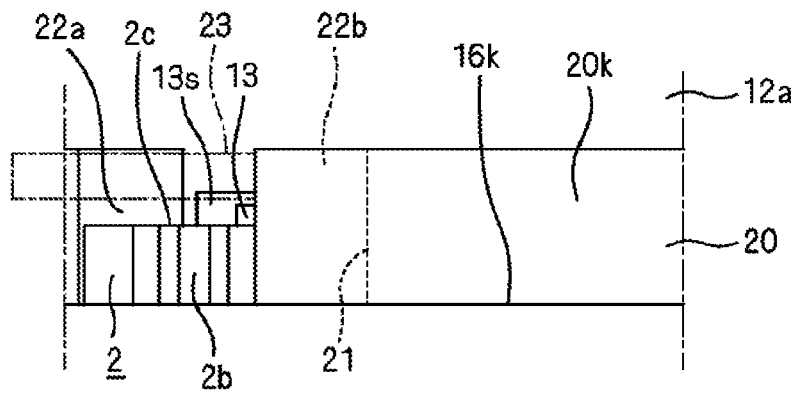
Figure 4C:
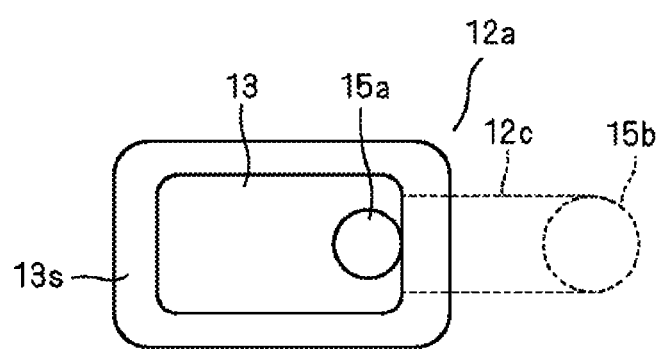

FIG. 4(a) is a schematic plan view showing the schematic configuration of a component transfer portion for transferring a component from the feeder 16 to the rotor 12. FIG. 4(b) is a schematic front view as viewed from a plane taken along a line 1-1 in FIG. 4(a). FIG. 4(c) is a schematic front view as viewed from a plane taken along a line 2-2 in FIG. 4(a). FIG. 5(a) to FIG. 5(d) are schematic plan views showing a mode of movement of the component in the component transfer portion for transferring a component from the feeder 16 to the rotor 12.

As shown in FIG. 4(a) and FIG. 4(b), on the first portion 16a of the feeder 16, a guide portion 20 is formed along an outer periphery 16k of the first portion 16a. The guide portion 20 has a guide surface 20k which vertically extends with respect to the conveyance surface 16s and prevents the movement of the component 2 to the outside of the feeder 16.

Oppositely facing surfaces 22a, 22b which are disposed perpendicular to the conveyance surface 16s and oppositely face each other are formed on the guide portion 20. A component passage 22 is formed between the oppositely facing surfaces 22a, 22b. The oppositely facing surfaces 22a, 22b are basically planer surfaces which are disposed parallel to each other. The component passage 22 has a first opening 22s disposed on an inner side of the feeder 16, and a second opening 22t formed on the outer periphery 16k of the first portion 16a. The component passage 22 extends to the second opening 22t from the first opening 22s.

Figure 5A:
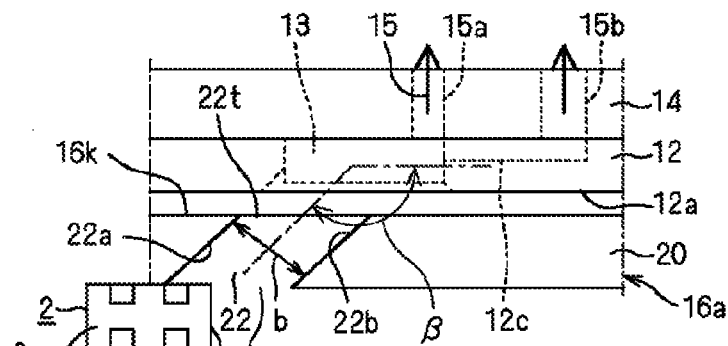
FIGS. 5(a) to 5(d) are schematic plan views showing the movement of a component in the component transfer portion where a component is transferred from the feeder to the rotor (embodiment 1).
Figure 5B:
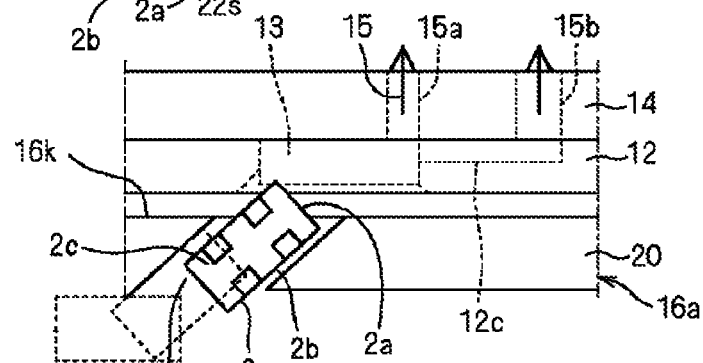
Figure 5C:
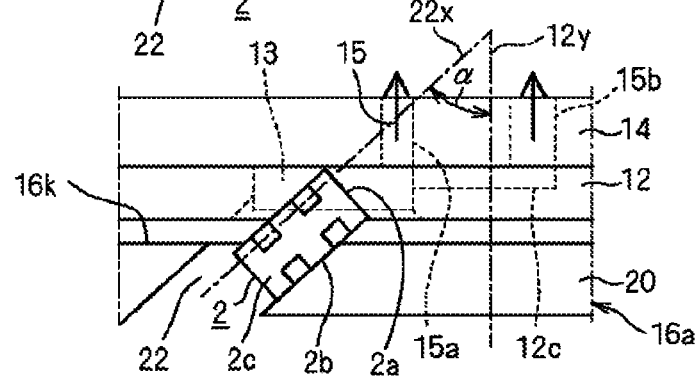

As shown in FIG. 4(a) and FIG. 5(a) to FIG. 5(d), the component passage 22 extends obliquely with respect to the rotor 12, and an angle α shown in FIG. 5(c), that is, the angle α made by a vertical direction 12y of the rotor 12 and one direction 22x along which the component passage 22 extends is set to 10° to 80°, for example.

As shown in FIG. 4(a) and FIG. 4(c), the rotor 12 is disposed adjacent to the first portion 16a of the feeder 16, and one main surface 12a of the rotor 12 oppositely faces the outer periphery 16k of the first portion 16a of the feeder 16. On the other main surface 12b side of the rotor 12, a suction member 14 is disposed adjacent to the rotor 12. On the other main surface 12b of the rotor 12, a groove 12c which communicates with the cavity 13 is formed. First and second suction holes 15a, 15b are formed in the suction member 14, and the first and second suction holes 15a, 15b are connected with a pressure reducing source not shown in the drawings. A gap not shown in the drawings is formed between the rotor 12 and the suction member 14. However, the gap is a slight gap and hence, it is safe to say that the other main surface 12b of the rotor 12 is substantially covered by the suction member 14. Even when such a gap is not formed so that the rotor 12 and the suction member 14 are brought into contact with each other, there arises no problem provided that an amount of slide resistance at the time of rotating the rotor 12 is at a level that no problem arises.

The rotor 12 is rotated intermittently and, as shown in FIG. 4(a) to FIG. 5(d), the rotation of the rotor 12 is stopped at a predetermined position where extending directional one end side X1 (a left side in FIG. 4(a) to FIG. 5(d)) of the cavity 13 is disposed adjacent to the second opening 22t of the component passage 22. At this stage of the operation, the cavity 13 extends parallel to the conveyance surface 16s, and an obtuse angle β is made by the extending directional the other end side X2 (a right side in FIG. 4(a) to FIG. 5(d)) of the cavity 13 and the component passage 22.

In the state where the rotor 12 is disposed at the predetermined position, the first suction hole 15a of the suction member 14 communicates with the extending directional the other end side X2 of the cavity 13, and the second suction hole 15b of the suction member 14 communicates with the extending directional the other end side X2 of the cavity 13 through the groove 12c. With such a configuration, vacuum suction is applied to the inside of the cavity 13 from the extending directional the other end side X2 by vacuum suction indicated by an arrow 15. Accordingly, the component 2 which enters the component passage 22 or approaches the first opening 22s of the component passage 22 is sucked, is made to pass through the component passage 22, and is moved to the cavity 13.

Figure 5D:
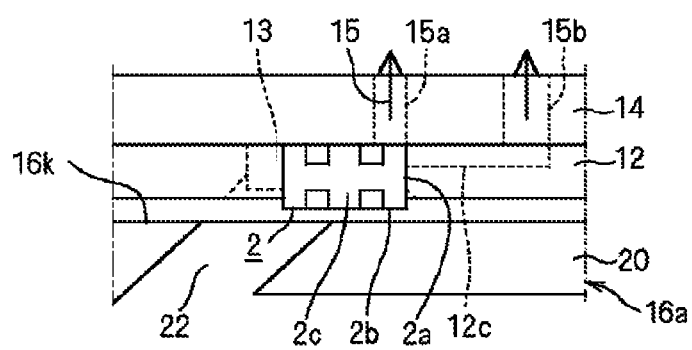

That is, the component 2 which is conveyed to a position in the vicinity of the first opening 22s of the component passage 22 as shown in FIG. 5(a) changes the direction thereof as indicated by a broken line in FIG. 5(b), and enters the component passage 22 using one end surface 2a as a leading side. Then, as shown in FIG. 5(c), the component 2 is moved toward the cavity 13 using one end surface 2a as the leading side. Then, as shown in FIG. 5(d), the longitudinal direction of the component 2 agrees with the extending direction of the cavity 13, and the component 2 is accommodated in the cavity 13 in a state where the side surface 2b of the component 2 is exposed to one main surface 12a side of the rotor 12.

A width b of the component passage 22 shown in FIG. 5(a) is set larger than a length W of the component 2 between a pair of side surfaces 2b which oppositely face each other, and is set smaller than the length L of the component 2 between the oppositely facing end surfaces 2a.

The width b of the component passage 22 is set such that a size obtained by arranging two or more components in a juxtaposed manner is avoided. That is, the width b of the component passage 22 is set such that the width b does not become a multiple of the size T of the component and a size obtained by adding the size T and the size W of the component, i.e. $T \times n_t + W \times n_w$. Here, $n_t$ is the number of the sizes T, and $n_w$ is the number of sizes W. If the relationship of 2×T>b can be established, a risk that two components enter the component passage 22 in the T size direction becomes eliminated. In the case of the component 2 where L=1.4 mm, W=1.0 mm, T=0.8 mm, the width b of the component passage 22 is set to 1.3 mm (b=1.3 mm), for example.

In the case where the relationship of b>W and the relationship of b>T are established, in both a state where the LW surface 2c of the component 2 is supported on the conveyance surface and a state where the LT surface 2b of the component 2 is supported on the conveyance surface, the component 2 can pass through the component passage 22. In this case, when the component 2 is accommodated in the cavity 13, there is a possibility that the LT surface 2b of the component 2 is exposed from the main surfaces 12a, 12b of the rotor 12 and also a possibility that the LW surface 2c of the component 2 is exposed from the main surfaces 12a, 12b of the rotor 12. Accordingly, the directions of the components 2 accommodated in the cavities 13 in the lateral direction are not aligned.

To align also the directions of the components 2 in the lateral directions, in the case of the components where the relationship of W>T is established (see FIG. 2), the height of the gap formed between the scrapers 16p to 16r of the selection component 30 and the conveyance surface 16s is set as described previously thus allowing only the components where the LW surface is supported on the conveyance surface 16s to pass below the scrapers 16p to 16r and to be introduced to the component passage 22 from the selection component 30. With such a configuration, it is possible to align the direction of the components 2 in the lateral direction and to accommodate the components 2 in the cavities 13 such that the LT surfaces 2b of the components 2 are exposed from the main surfaces 12a, 12b of the rotor 12.

Figure 6:
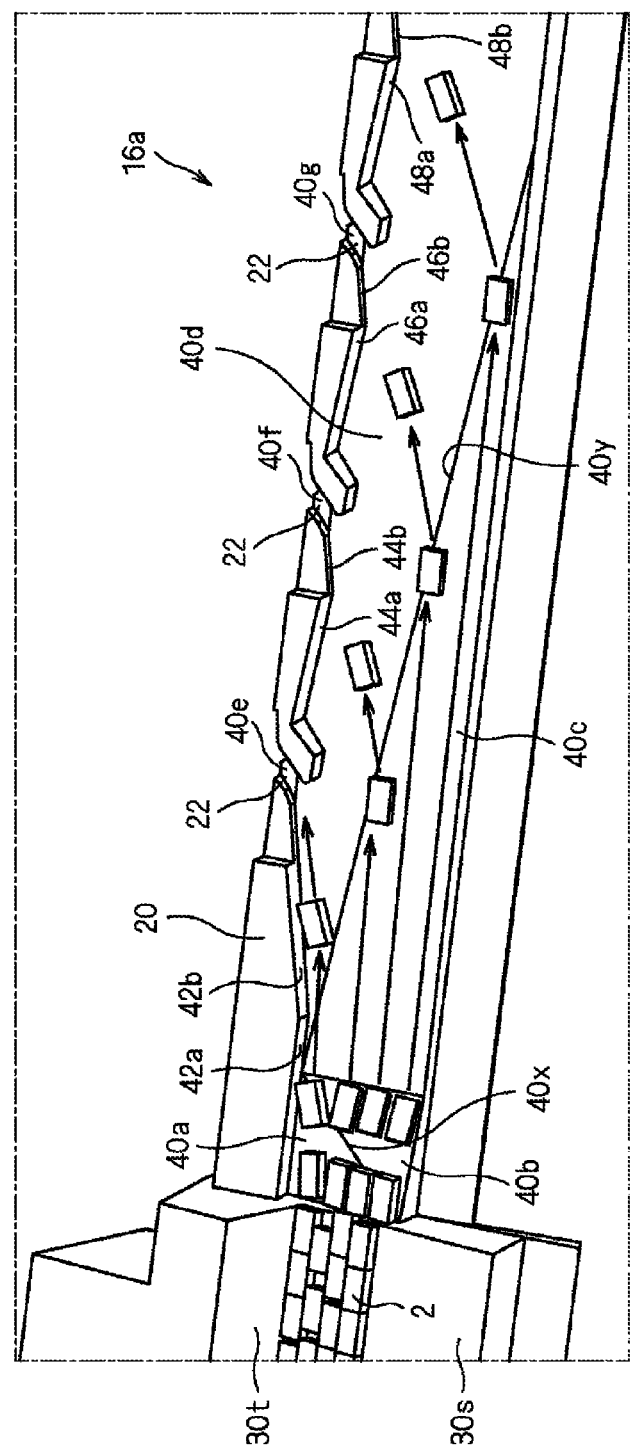
FIG. 6 is a perspective view of a main component showing the detailed configuration of a first portion of the feeder (embodiment 1).
Figure 8:
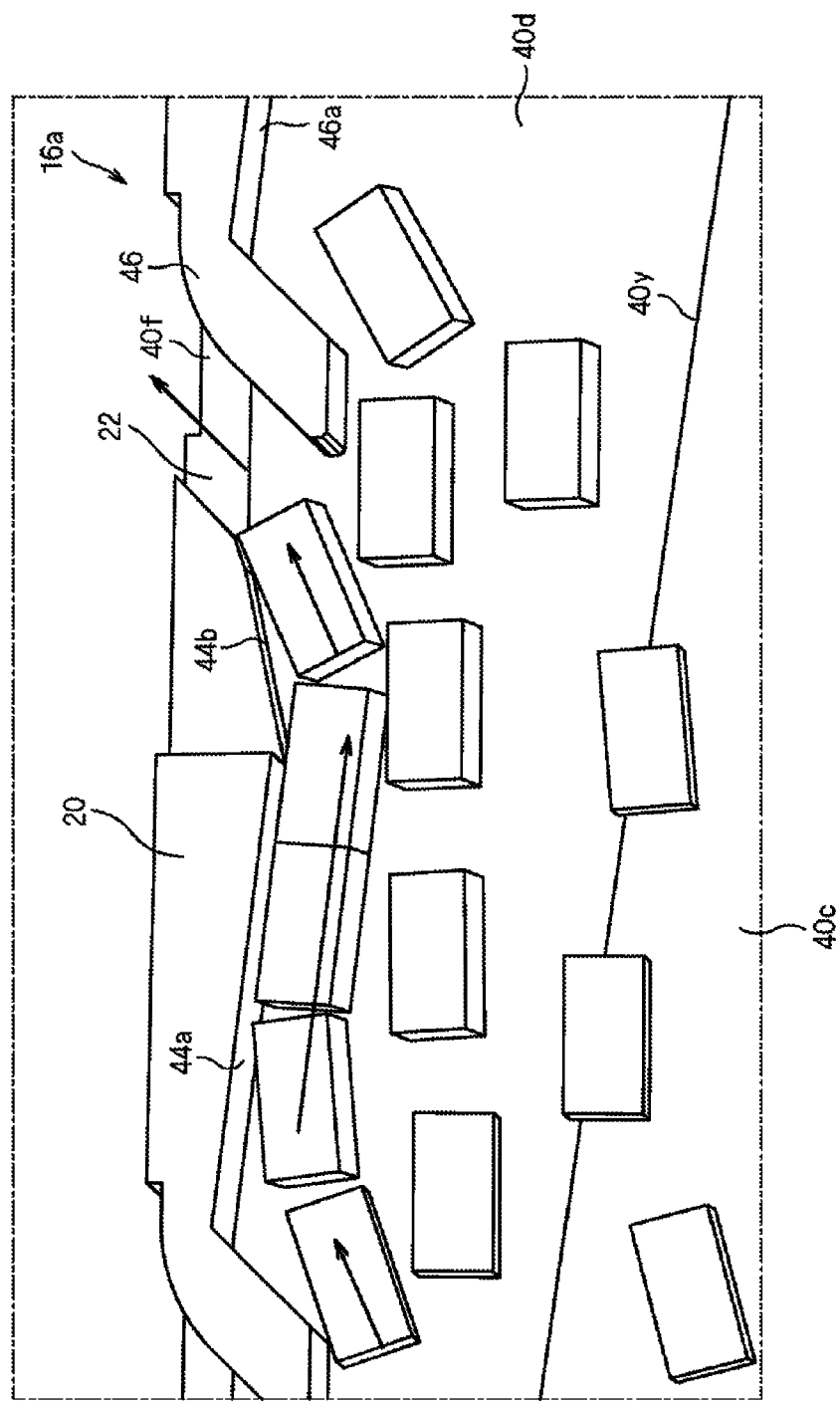
FIG. 8 is a perspective view of a main component showing the detailed configuration of the first portion of the feeder (embodiment 1).

In the course of operation where the component 2 is accommodated in the cavity 13, the component 2 is moved while the direction of the component 2 is changed by rotation about a corner 21 surrounded by a circle indicated by a broken line in FIG. 4(a). As shown in FIG. 6 and FIG. 8 referenced later, by rounding the corner 21, the component 2 can be moved while the direction of the component 2 is smoothly changed.

As shown in FIG. 4(a) and FIG. 4(c), a tapered portion 13s may be formed on one main surface 12a of the rotor 12 around the cavity 13. By forming the tapered portion 13s around the cavity 13, as shown in FIG. 4(a), when the rotor 12 is rotated in a state where the succeeding component 2 approaches the component 2x accommodated in the cavity 13, the succeeding component 2 can be retracted from the rotor 12 by the tapered portion 13s and hence, it is possible to prevent the succeeding component 2 from biting into the cavity 13 of the rotor 12.

Further, a top plate 23 indicated by a chain line in FIG. 4(b) may be disposed above the component passage 22. In this case, when the succeeding component 2 is retracted from the rotor 12 by the tapered portion 13s, it is possible to prevent the posture of the succeeding component 2 from being disrupted such as rising. Further, it is possible to stably suck the component 2 which enters the component passage 22 or approaches the first opening 22s of the component passage 22. Assuming a height of a gap formed between the top plate 23 and the conveyance surface 16s as "h," in the case of the component where the relationship of W>T is established (see FIG. 2), the height h is set to satisfy the relationship of T<h<W. For example, the height h of the gap is set to 0.9 mm (h=0.9 mm) in the case of the component 2 where T=0.8 mm, W=1.0 mm.

When locking of the component 2 is detected in a route from the component passage 22 to the cavity 13, the component 2 may be pushed back by the injection of air or driving of a pin.

Figure 7:
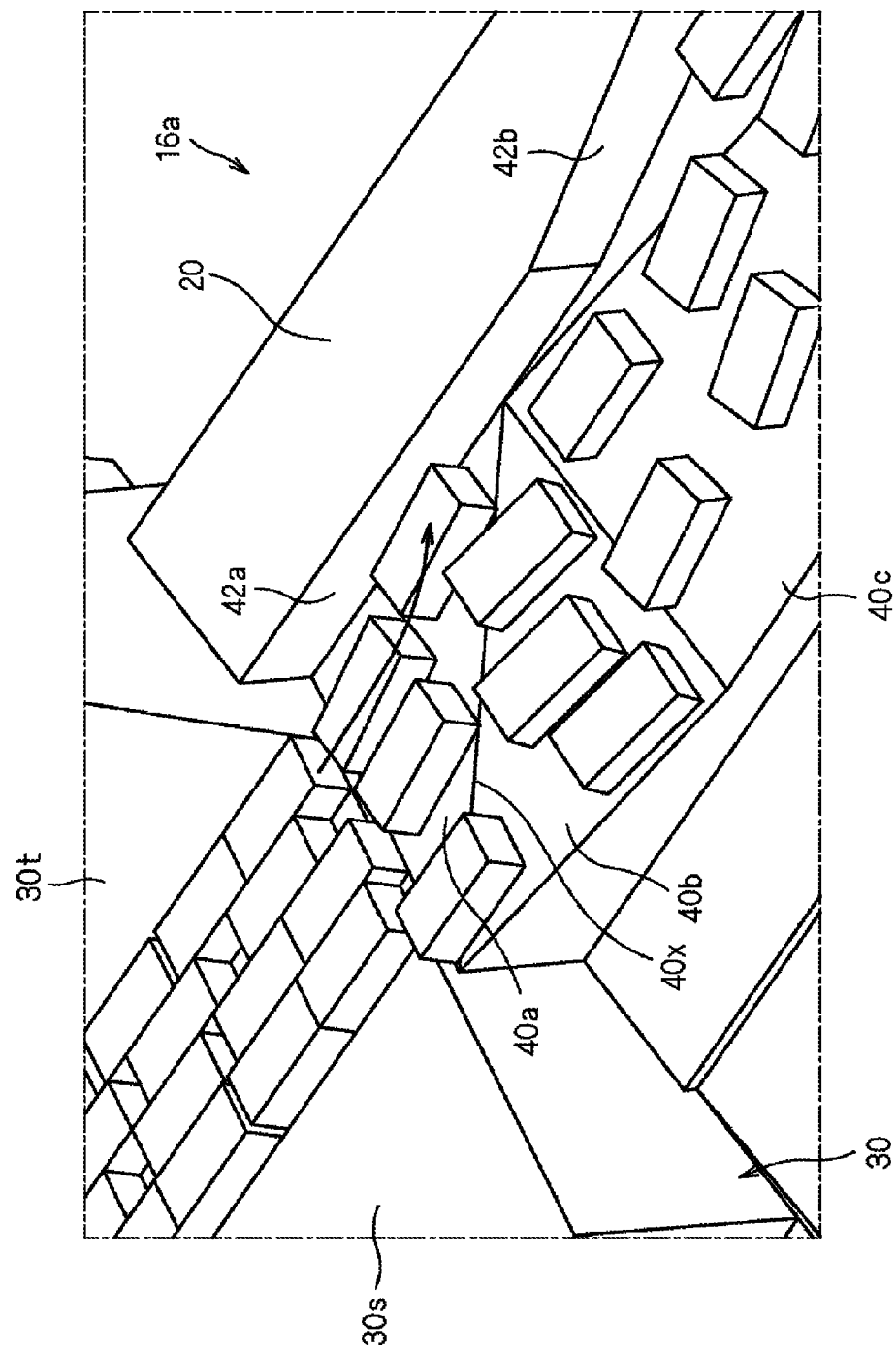
FIG. 7 is a perspective view of a main component showing the detailed configuration of the first portion of the feeder (embodiment 1).

FIG. 6 to FIG. 8 are perspective views of a main component showing the detailed configuration of the first portion 16a of the feeder 16. As shown in FIG. 6 to FIG. 8, a stepped portion and inclined portion are formed on the conveyance surface of the first portion 16a of the feeder 16 so that the components 2 are moved while being scattered to four component passages 22 formed in the guide portion 20.

That is, the components 2 which pass below the scrapers 16p to 16r in the selection component 30 (see FIG. 3(a) and FIG. 3(b)) are moved on a first horizontal conveyance surface 30s in a translational state where the components 2 are disposed collectively in the longitudinal direction along guide surfaces 30t as shown in FIG. 6. Then, the components 2 pass the stepped portion and are moved to a second horizontal conveyance surface 40a, and the components 2 are separated from each other in the longitudinal direction. Next, the components 2 descend a first inclined conveyance surface 40b, and advance toward a third horizontal conveyance surface 40c. An intersecting line 40x between the second horizontal conveyance surface 40a and the first inclined conveyance surface 40b intersects obliquely with a component feeding direction (a direction from one end 16x side to the other end 16y side of the feeder 16). Accordingly, on the third horizontal conveyance surface 40c, a distance between respective rows of the components 2 is increased in a direction perpendicular to the component feeding direction. Next, the components of each row descend a second inclined conveyance surface 40d, and are moved toward the component passages 22 respectively. An intersecting line 40y between the third horizontal conveyance surface 40c and the second inclined conveyance surface 40d obliquely intersects with the component feeding direction and hence, the components 2 are moved obliquely with respect to the component feeding direction on the third inclined conveyance surface 40d. The second inclined conveyance surface 40d extends to a middle portion of the component passage 22, and horizontal conveyance surfaces 40e to 40g are connected to the second inclined conveyance surface 40d in the component passage 22.

As shown in FIG. 6, introduction guide surfaces 42a, 42b; 44a, 44b; 46a, 46b; 48a, 48b are formed in the guide portion 20 at an upstream side of the component passage 22 in the moving direction of the components 2 and above the conveyance surfaces 40a to 40d respectively. In a plan view of the aligning and feeding device 10, the introduction guide surfaces 42a, 42b; 44a, 44b; 46a, 46b; 48a, 48b extend to the component passage 22 in a bent or curved manner. Further, the conveyance surfaces 40a to 40d extend in conformity with bent or curved shapes of the introduction guide surfaces 42a, 42b; 44a, 44b; 46a, 46b; 48a, 48b.

To be more specific, on the conveyance surface 40d, a space which allows the movement of the components 2 is formed in the direction that the accommodating member is disposed in conformity with the bent or curved shapes of the introduction guide surfaces 42a, 42b; 44a, 44b; 46a, 46b; 48a, 48b. With such a configuration, the components 2 which are moved on the conveyance surface 40d along the introduction guide surfaces 42a, 42b; 44a, 44b; 46a, 46b; 48a, 48b can change the directions thereof without being interfered with by other components parallel to the components 2 or the succeeding components when the directions of the components 2 are changed by bent or curved portions of the introduction guide surfaces 42a, 42b; 44a, 44b; 46a, 46b; 48a, 48b. Accordingly, the components 2 which are moved along the introduction guide surfaces 42a, 42b; 44a, 44b; 46a, 46b; 48a, 48b can be moved to the component passages 22 with certainty and hence, a component filling efficiency of the cavities 13 can be enhanced.

With the use of the aligning and feeding device 10, as shown in FIG. 3(a) to FIG. 5(d), the aligning and feeding device 10 can move the component 2 placed on the conveyance surface 16s to the cavity 13 through the component passage 22 in accordance with following steps. That is, first, the component 2 is supplied onto the conveyance surface 16s on one end 16x side of the feeder 16. Next, the component 2 supplied onto the conveyance surface 16s of the feeder 16 is moved so as to make the component 2 enter the component passage 22 or approach to the first opening 22s of the component passage 22. Next, in a state where the rotor 12 is disposed such that the cavity 13 extends parallel to the conveyance surface 16s, the extending directional one end side X1 of the cavity 13 is disposed adjacent to the second opening 22t of the component passage 22, and an obtuse angle β is made between the extending directional the other end side X2 of the cavity 13 and the component passage 22, vacuum suction is applied to the inside of the cavity 13 from the extending directional the other end side X2 of the cavity 13. With such vacuum suction, the component 2 which enters the component passages 22 or approach the first opening 22s of the component passage 22 is moved to the cavity 13 through the component passage 22, and the component 2 is accommodated in the cavity 13 in a state where the longitudinal direction of the component 2 and the extending direction of the cavity 13 agree with each other.

The cavity 13 extends parallel to the main surfaces 12a, 12b of the rotor 12 and hence, it is possible to accommodate the component 2 in the cavity 13 by aligning the direction of the component 2 such that the longitudinal direction of the component 2 extends parallel to the main surfaces 12a, 12b of the rotor 12.

Figure 9:
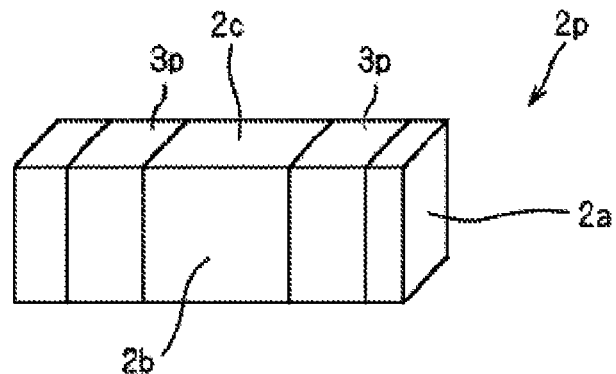
FIGS. 9(a) and 9(b) are perspective views of a component (Modification of embodiment 1).
Figure 9B:
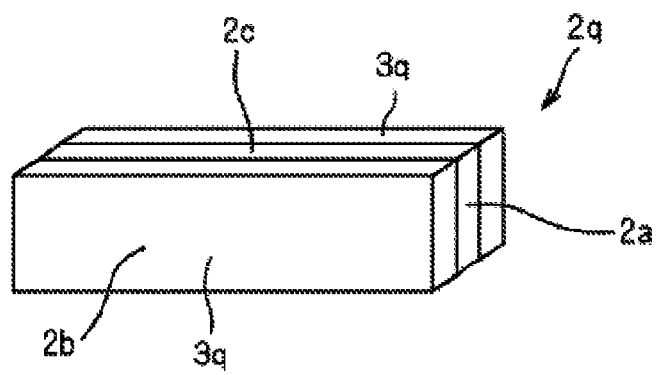

The aligning and feeding device 10 can be also used for aligning and feeding components having a rectangular parallelepiped shape besides the component 2. For example, the aligning and feeding device 10 can be also used for aligning and feeding a component 2p where electrodes 3p which surround side surfaces 2b, 2c by one turn are formed as shown in FIG. 9(a) which is a perspective view, and a component 2q where a pair of electrodes 3q which respectively cover a pair of side surfaces 2b which oppositely face each other as a whole as shown in FIG. 9(b) which is a perspective view, for example.

The cavities 13 are not limited to cavities which penetrate between the main surfaces 12a, 12b of the rotor 12, and may be cavities which open in only one-side main surface of the rotor 12 which oppositely faces the feeder 16. Also in this case, by sucking the inside of the cavity 13 from the extending directional the other end side X2 of the cavity 13 in a state where the extending directional one end side X1 of the cavity 13 which extends parallel to one-side main surface of the rotor 12 is disposed adjacent to the second opening 22t of the component passage 22 and an obtuse angle β is made between the extending directional the other end side X2 of the cavity 13 and the component passage 22, the component 2 placed on the conveyance surfaces 40a to 40d is moved to the cavity 13 through the component passage 22, and the component 2 can be accommodated in the cavity 13 while aligning the direction of the component 2 such that the longitudinal direction of the component 2 extends parallel to one-side main surface of the rotor 12.

Embodiment 2

Figure 10:
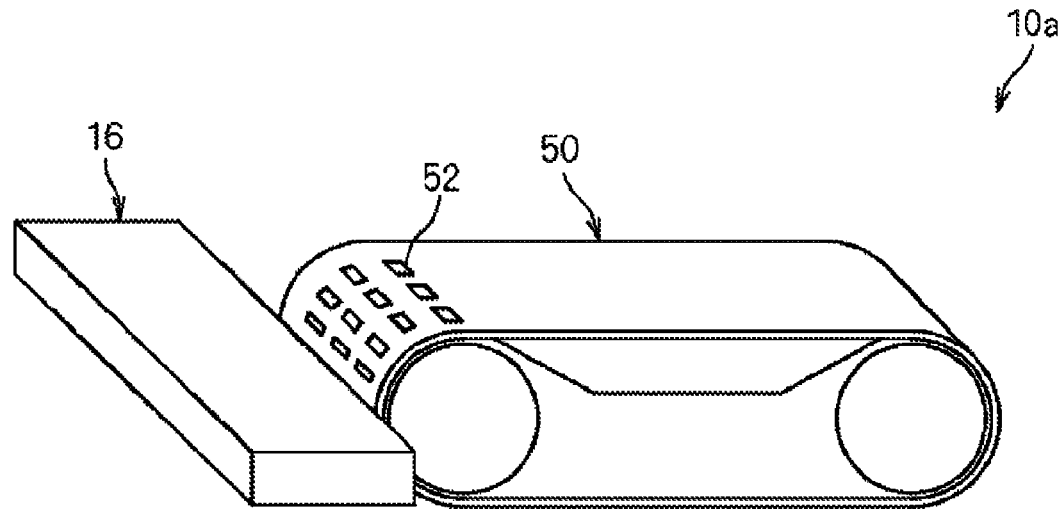
FIG. 10 is a schematic front view showing the schematic configuration of an aligning and feeding device (embodiment 2).

FIG. 10 is a perspective view showing the schematic configuration of an aligning and feeding device 10a of an embodiment 2. As shown in FIG. 10, in the aligning and feeding device 10a, a horizontal conveyance belt 50 which circulates in the horizontal direction is disposed adjacent to a feeder 16 having the same configuration as the feeder 16 of the embodiment 1. Cavities 52 for accommodating components respectively are formed in the horizontal conveyance belt 50. The horizontal conveyance belt 50 forms an accommodating member, and a suction member (not shown in the drawing) for sucking components into the cavities 52 is disposed in the inside of the horizontal conveyance belt 50.

Embodiment 3

Figure 11:
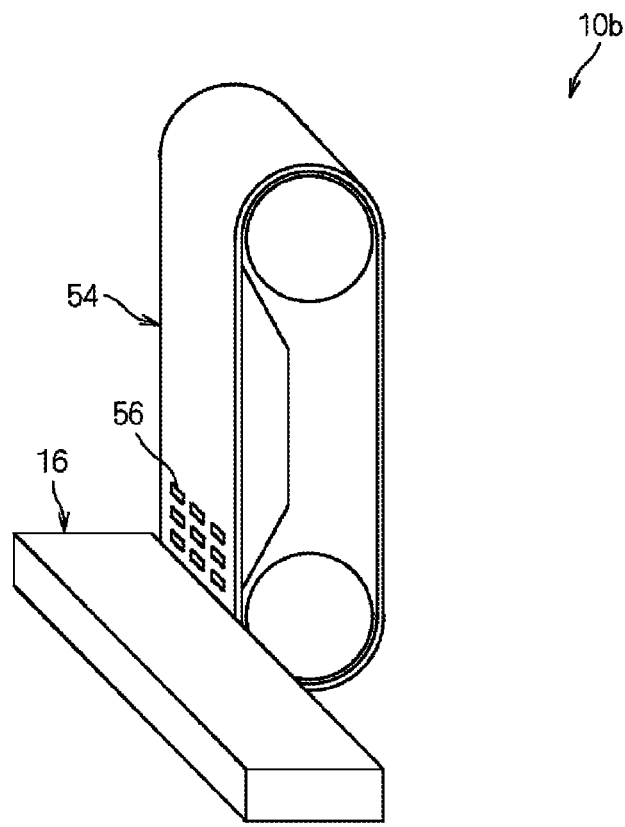
FIG. 11 is a schematic front view showing the schematic configuration of an aligning and feeding device (embodiment 3).

FIG. 11 is a perspective view showing the schematic configuration of an aligning and feeding device 10b of an embodiment 3. As shown in FIG. 11, in the aligning and feeding device 10b, a vertical conveyance belt 54 which circulates in the vertical direction is disposed adjacent to a feeder 16 having the same configuration as the feeder 16 of the embodiment 1. Cavities 56 for accommodating components respectively are formed in the vertical conveyance belt 54. The vertical conveyance belt 56 forms an accommodating member, and a suction member (not shown in the drawing) for sucking components into the cavities 56 is disposed in the inside of the vertical conveyance belt 54.

Embodiment 4

Figure 12:
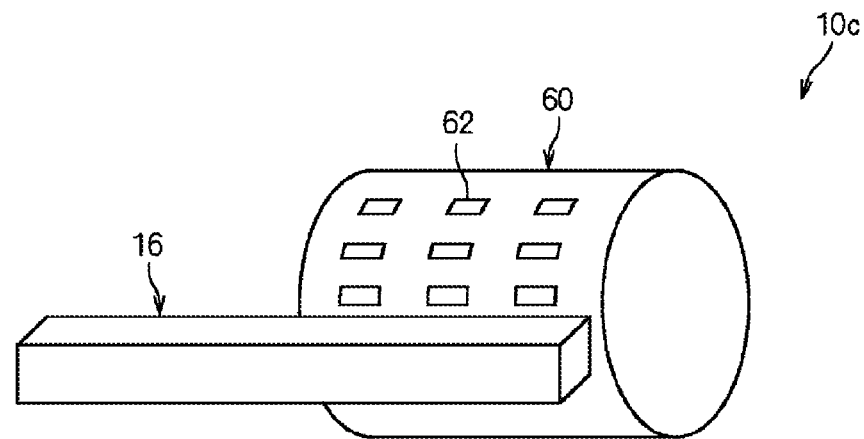
FIG. 12 is a schematic front view showing the schematic configuration of an aligning and feeding device (embodiment 4).
Figure 13:
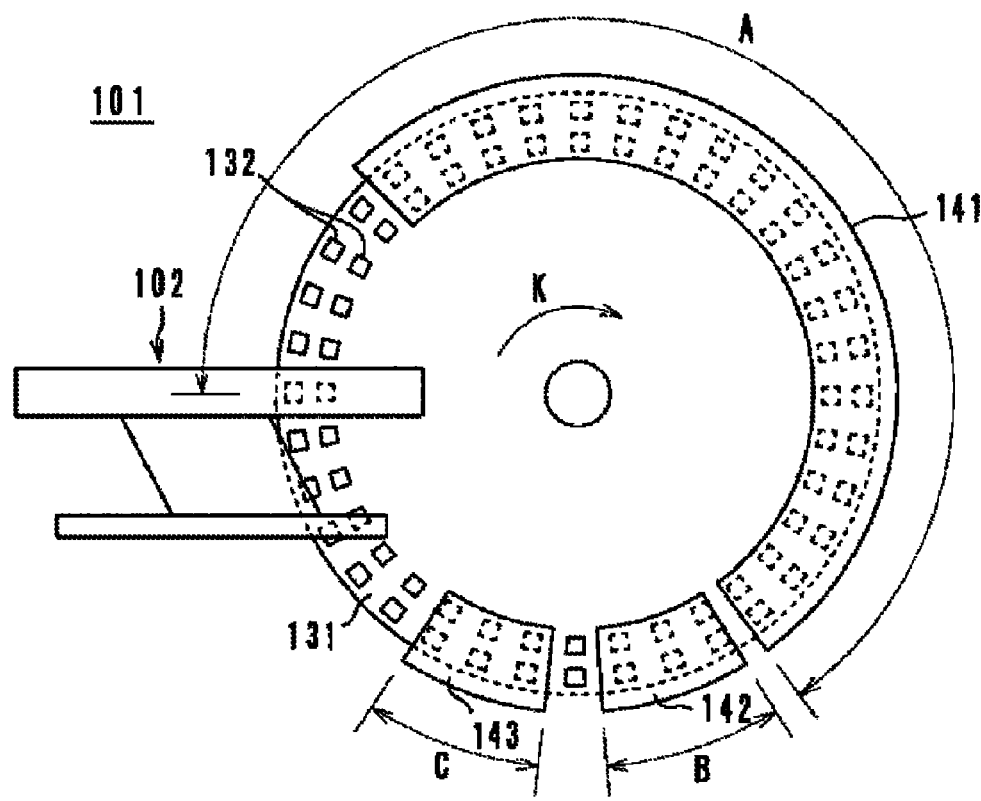
FIG. 13 is a schematic front view of a handling device for a chip-type electronic component (conventional example 1).
Figure 14:
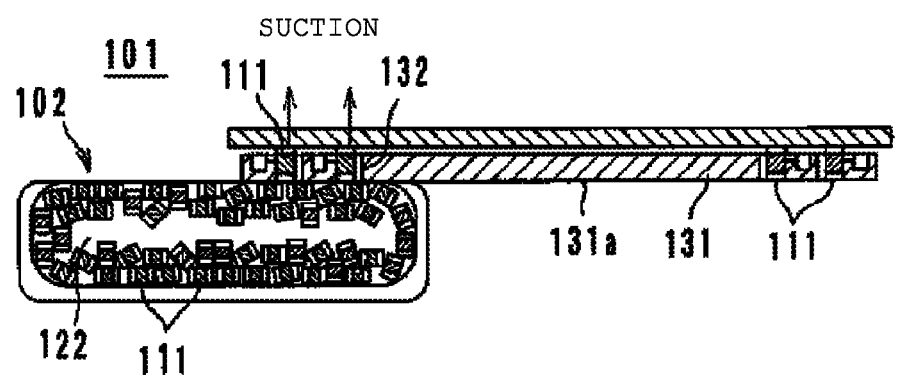
FIG. 14 is a horizontal cross-sectional view of the handling device for a chip-type electronic component (conventional example 1).

FIG. 12 is a perspective view showing the schematic configuration of an aligning and feeding device 10c of an embodiment 4. As shown in FIG. 12, in the aligning and feeding device 10c, a circular cylindrical rotary drum 60 is disposed adjacent to a feeder 16 having the same configuration as the feeder 16 of embodiment 1. Cavities 62 for accommodating components respectively are formed in an outer peripheral surface of the rotary drum 60. The rotary drum 60 forms an accommodating member, and a suction member (not shown in the drawing) for sucking components into the cavities 62 is disposed in the inside of the rotary drum 60.

To recapitulate the above, with the use of the aligning and feeding device described heretofore, a component having a rectangular parallelepiped shape where the component includes a pair of rectangular end surfaces which oppositely face each other and a longitudinal direction of the component extends between the end surfaces is accommodated in the cavity formed on the accommodating member while the direction of the component is aligned such that the longitudinal direction of the component extends parallel to the main surface of the accommodating member.

The present disclosure is not limited to the above described embodiments, and the present disclosure can be carried out by adding various modifications to the embodiments.

For example, the conveyance surface is not limited to the conveyance surface where a component placed on the conveyance surface is moved relative to the conveyance surface due to vibrations, and the conveyance surface may be configured such that a conveyance surface per se is moved in a predetermined direction as in the case of a belt conveyer thus moving the component placed on the conveyance surface together with the conveyance surface.

The invention claimed is:

1. An aligning and feeding device used for a component having a rectangular parallelepiped shape where the component includes a pair of rectangular end surfaces which oppositely face each other and four side surfaces which connect the end surfaces to each other and a direction extending between the end surfaces of the component is set as a longitudinal direction, the aligning and feeding device comprising:
   a conveyance surface for moving the component placed on the conveyance surface;
   a component passage disposed above the conveyance surface, having a first opening and a second opening, and extending from the first opening to the second opening,
      the component passage having a width which is larger than at least one of a length between one pair of side surfaces of the component which oppositely face each other and a length between the other pair of side surfaces of the component which oppositely face each other and the component passage having the width which is smaller than a length between the end surfaces of the component thus allowing the component to pass through the component passage;
   an accommodating member having a main surface and a plurality of cavities which are continuously formed with the main surface, extend in an extending direction which is a direction parallel to the main surface and are configured to accommodate the component such that the extending direction and the longitudinal direction of the component agree with each other,
      the accommodating member configured to be disposed such that the cavities extend parallel to the conveyance surface, one end side of each of the cavities in the extending direction is disposed adjacent to the second opening, and the other end side of said each of the cavities in the extending direction and the component passage make an obtuse angle; and
   a suction member configured to apply a vacuum suction to the other end side of said each of the cavities in the extending direction when the accommodating member is disposed such that the cavities extend parallel to the conveyance surface, one end side of said each of the cavities in the extending direction is disposed adjacent to the second opening, and the other end side of said each of the cavities in the extending direction and the component passage make an obtuse angle.

2. The aligning and feeding device according to claim 1, further comprising a height restricting member which is disposed upstream of the first opening of the component passage in a moving direction of the component such that a gap of a predetermined height is formed between the conveyance surface and the height restricting member, and only the component which passes through the gap is allowed to enter the component passage or to approach the first opening, the length between one pair of side surfaces is larger than the length between the other pair of side surfaces, and the predetermined height is smaller than the length between said one pair of side surfaces of the component which oppositely face each other and is larger than the length of said other side surfaces of the component which oppositely face each other.

3. The aligning and feeding device according to claim 1, further comprising an introducing guide surface disposed upstream of the component passage in the moving direction of the component and above the conveyance surface, wherein the aligning and feeding device is, in a plan view of the aligning and feeding device, configured such that the introducing guide surface extends to the component passage by being bent or curved, the conveyance surface extends in conformity with a bent or curved shape of the introducing guide surface, and the component is movable on the conveyance surface along the introducing guide surface.

4. An aligning method for aligning a component having a rectangular parallelepiped shape where the component includes a pair of rectangular end surfaces which oppositely face each other and four side surfaces which connect the end surfaces to each other and a direction extending between the end surfaces of the component is set as a longitudinal direction, the aligning method comprising:

supplying the component onto a conveyance surface;

making the component enter a component passage which has a first opening and a second opening, extends from the first opening to the second opening, has a width which is larger than at least one of a length between one pair of side surfaces of the component which oppositely face each other and a length between the other pair of side surfaces of the component which oppositely face each other and is smaller than a length between the end surfaces of the component, and allows the component to pass through the component passage or approach the first opening while moving the component supplied onto the conveyance surface; and disposing an accommodating member having a main surface and a plurality of cavities which are continuously formed with the main surface, extend in an extending direction which is a direction parallel to the main surface and are configured to accommodate the component such that the extending direction and the longitudinal direction of the component agree with each other, applying a vacuum suction to the inside of each of the cavities from the other end side in the extending direction in a state where the cavities extend parallel to the conveyance surface, one end side of each of the cavities in the extending direction is disposed adjacent to the second opening, and the other end side of said each of the cavities in the extending direction and the component passage make an obtuse angle, moving the component which enters the component passage or approaches the first opening to said each of the cavities through the component passage, and accommodating the component in said each of the cavities in a state where the longitudinal direction of the component and the extending direction of said each of the cavities agree with each other.

5. The aligning method according to claim 4, wherein the length between said one pair of side surfaces is larger than the length between said the other pair of side surfaces, and disposing a height restricting member which forms a gap of a predetermined height between the conveyance surface and the height restricting member, and only the component which passes through the gap is allowed to enter the component passage or to approach the first opening, and the predetermined height is smaller than the length between said one pair of side surfaces of the component which oppositely face each other and is larger than the length of said the other side surfaces of the component which oppositely face each other.

6. The aligning method according to claim 4, wherein in the second step, the component supplied onto the conveyance surface is made to enter the component passage or to approach the first opening by moving the component on the conveyance surface which extends in conformity with a bent or curved shape of an introducing guide surface along the introducing guide surface having the bent or curved shape as viewed in a plan view.

\* \* \* \* \*